(12) United States Patent
Shibata (10) Patent No.: US 7,932,646 B2
(45) Date of Patent: Apr. 26, 2011

(54) EXPOSURE APPARATUS WITH A STAGE, DRIVING UNIT, AND FORCE APPLYING UNIT HAVING A SEPARATE MAGNETIC SHIELD

(75) Inventor: Yugo Shibata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 427 days.

(21) Appl. No.: 11/971,067

(22) Filed: Jan. 8, 2008

(65) Prior Publication Data

US 2008/0169708 A1 Jul. 17, 2008

(30) Foreign Application Priority Data

Jan. 15, 2007 (JP) ................................ 2007-005582
Dec. 13, 2007 (JP) ................................ 2007-322424

(51) Int. Cl.
*H02K 41/00* (2006.01)
(52) U.S. Cl. ............... 310/12.31; 310/12.05; 310/12.06; 355/53
(58) Field of Classification Search ............... 310/12.01, 310/12.31, 12.05, 12.06
See application file for complete search history.

(56) References Cited

U.S. PATENT DOCUMENTS

| | | | | |
|---|---|---|---|---|
| 6,326,706 B1 * | 12/2001 | Zhang | ........................ | 310/12.31 |
| 6,469,406 B1 * | 10/2002 | Hwang et al. | .............. | 310/12.29 |
| 6,731,026 B1 * | 5/2004 | Kawaguchi et al. | ........ | 310/12.29 |
| 6,750,571 B2 * | 6/2004 | Tominaga et al. | .......... | 310/12.26 |
| 6,762,516 B2 * | 7/2004 | Maruyama | ................... | 310/12.04 |
| 6,903,468 B2 * | 6/2005 | Korenaga | ..................... | 310/12.19 |
| 7,663,271 B2 * | 2/2010 | Akieda et al. | ............... | 310/12.31 |
| 2003/0155820 A1 | 8/2003 | Tominaga | | |
| 2004/0066097 A1 * | 4/2004 | Kobayashi et al. | .............. | 310/13 |
| 2004/0095563 A1 | 5/2004 | Korenaga | | |
| 2005/0018165 A1 * | 1/2005 | Akutsu | ............................ | 355/72 |
| 2006/0158129 A1 | 7/2006 | Kitagawa | | |
| 2008/0100149 A1 * | 5/2008 | Shibata | ........................... | 310/12 |
| 2008/0158539 A1 * | 7/2008 | Shibata | ........................... | 355/72 |
| 2008/0169708 A1 * | 7/2008 | Shibata | ........................... | 310/12 |

FOREIGN PATENT DOCUMENTS

| | | |
|---|---|---|
| EP | 1071097 A | 1/2001 |
| EP | 1398109 A | 3/2004 |
| EP | 1524556 A | 4/2005 |
| JP | 2003-244927 A | 8/2003 |
| JP | 2004-079639 A | 3/2004 |
| JP | 2005-310808 A | 11/2005 |

* cited by examiner

*Primary Examiner* — Karl I Tamai
(74) *Attorney, Agent, or Firm* — Canon USA, Inc. IP Division (57) ABSTRACT

A device includes a stage, a force applying unit configured to apply a magnetically repulsive force to the stage, the force applying unit including a first magnet provided at the stage, and a second magnet provided at an end of a movement stroke of the stage so as to face the first magnet, a driving unit configured to drive the stage within the movement stroke, a magnetic-flux reinforcement unit configured to reinforce magnetic flux of the second magnet, and a magnetic shield configured to shield the magnetic flux of the second magnet.

5 Claims, 12 Drawing Sheets

EXPOSURE APPARATUS WITH A STAGE, DRIVING UNIT, AND FORCE APPLYING UNIT HAVING A SEPARATE MAGNETIC SHIELD

BACKGROUND OF THE INVENTION

1. Field of the Invention

The present invention relates to a device for positioning an object. The device can be used, for example in an exposure apparatus. The invention also relates to an exposure apparatus having the device.

2. Description of the Related Art

A scanning exposure apparatus usually has a stage device that moves a reticle. Some suggestions have been made for a driving mechanism of the stage device so as to improve the throughput of the exposure apparatus.

Figure 13A:
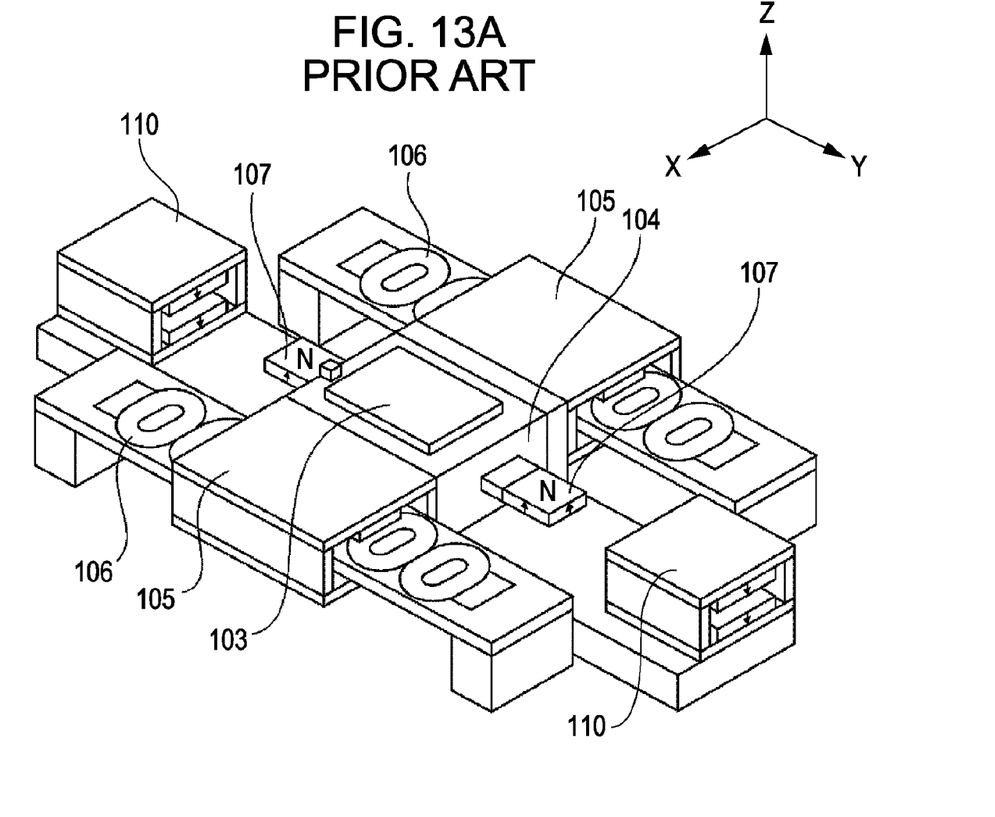
FIGS. 13A and 13B are illustrations showing a known device.

FIG. 13A shows a stage device suggested in Japanese Patent Laid-Open No. 2004-079639. A reticle stage 104 has a reticle 103 placed thereon and moves in a scanning direction (Y direction). Linear motors are provided on both sides of the reticle stage 104. The linear motors include movers 105 fixed on both sides of the reticle stage 104 and each having a permanent magnet, and stators 106 fixed to a base (not shown) and each having a plurality of coils.

In addition, repulsive movers 107 are provided at front and back sides of the reticle stage 104 in a movement direction thereof, and repulsive stators 110 are provided at both ends of a movement stroke of the reticle stage 104. The repulsive movers 107 and repulsive stators 110 have permanent magnets, whereby the reticle stage 104 can be accelerated or decelerated using repulsive forces generated between the permanent magnets of the repulsive movers 107 and those of the repulsive stators 110.

Figure 13B:
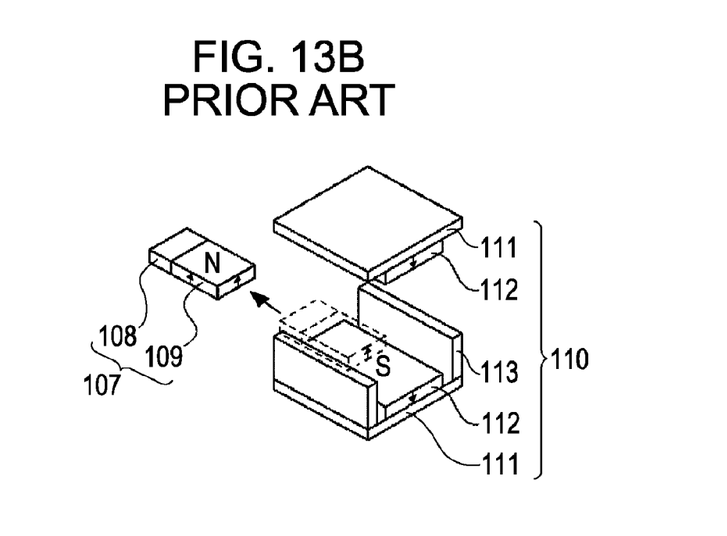

FIG. 13B is an illustration showing the repulsive mover 107 and repulsive stator 110. The repulsive stator 110 includes a pair of permanent magnets 112 disposed such that the N-pole of one of the permanent magnets 112 faces the S-pole of the other, and yokes 113 that allow magnetic flux to circulate between the pair of permanent magnets 112 via lateral sides. The repulsive mover 107 includes a permanent magnet 109. When the repulsive mover 107 is located at a position indicated by a dotted line, like poles of the permanent magnet 109 and one of the permanent magnets 112 face each other, whereas like poles of the permanent magnet 109 and the other one of the permanent magnets 112 face each other. Using repulsive forces between the permanent magnets 112 and 109, a force can be applied to the reticle stage 104 from either end of the movement stroke of the reticle stage 104. With such a configuration, the reticle stage 104 is driven while preventing the coils (106) from being heated due to driving of the linear motors.

In such a configuration in which a force is applied to a stage by using a repulsive force from permanent magnets, magnetic flux may be noticeably scattered and leak to the surrounding when the repulsive force is generated. In particular, a stage device with a high acceleration may cause large leakage flux, and thus, magnetic substances provided around the stage may be attracted.

In many cases, a measurement sensor and a processing unit may be arranged around a stage device. If these components and members for supporting these components are attracted by the leakage flux, positioning accuracy of the stage and processing accuracy of an object placed on the stage may be decreased. In particular, an exposure apparatus has an illumination optical system, a projection optical system, and the like, arranged around a stage device. If supporting members of these systems are magnetically attracted, exposure accuracy may be decreased.

SUMMARY OF THE INVENTION

Accordingly, the present invention provides a device for accelerating or decelerating a stage by using the repulsive force of magnets, and which can reduce the leakage of magnetic flux to the surroundings and/or affecting adjacent components when the magnets generate the repulsive force.

According to an aspect of the present invention, a device includes a stage, a force applying unit configured to apply a magnetically repulsive force to the stage, the force applying unit including a first magnet provided at the stage, and a second magnet provided at an end of a movement stroke of the stage so as to face the first magnet, a driving unit configured to drive the stage within the movement stroke, a magnetic-flux reinforcement unit configured to reinforce magnetic flux of the second magnet, and a magnetic shield configured to shield the magnetic flux of the second magnet.

Further features of the present invention will become apparent from the following description of exemplary embodiments with reference to the attached drawings.

DESCRIPTION OF THE EMBODIMENTS

First Embodiment

Figure 1A:
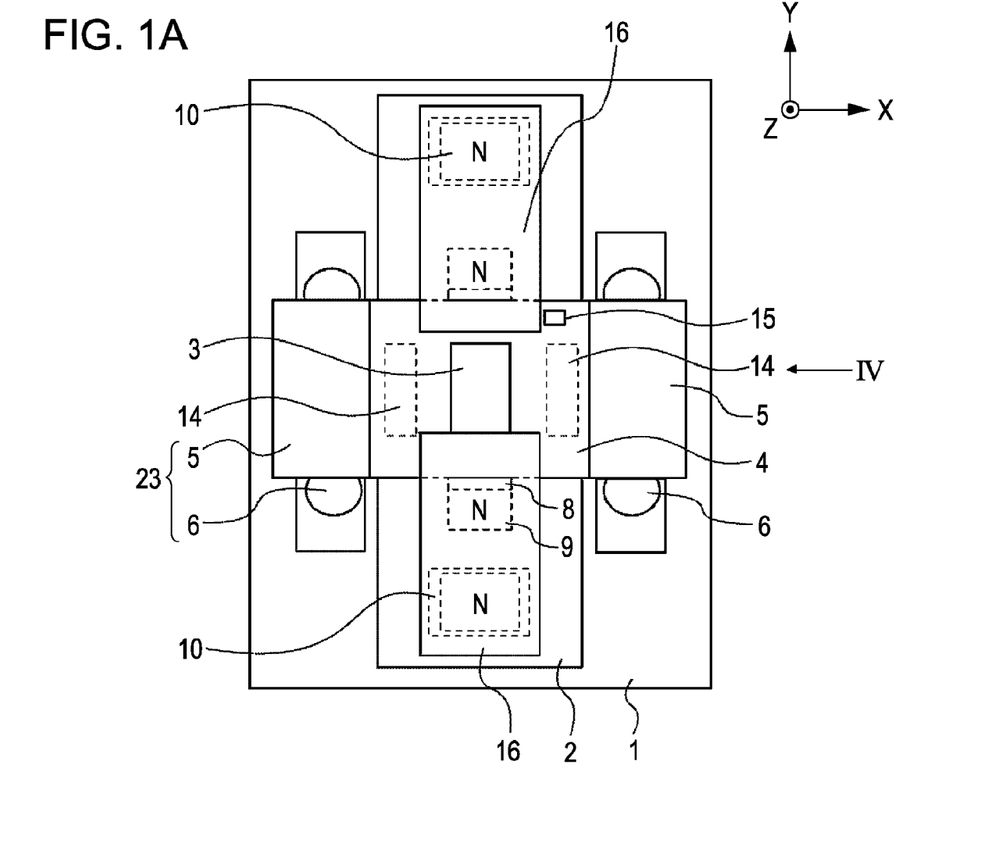
FIGS. 1A and 1B are illustrations showing a stage device according to a first embodiment.

FIG. 1A is a plan view showing a stage device according to a first embodiment of the present invention. This embodiment shows an exemplary stage device having an original placed thereon and moving in an exposure apparatus. Such a stage device, however, may be applied to other kinds of apparatus other than exposure apparatus, and may have an object to be positioned such as a wafer, instead of the original reticle.

The stage device includes a stage 4 that moves while an original 3 is placed thereon, a guide 2 that guides the stage 4 via gas bearings 14, and linear motors (driving units) 23 that drives the stage 4 in Y direction (hereinafter, "movement direction" represents the Y direction). The guide 2 is fixed to a base 1 and has a guide surface in the X-Y plane. The gas bearings 14 may be replaced with other kinds of bearings depending on the positioning accuracy required for a stage. The original 3 is held with a chuck (not shown) fixed to the stage 4. The chuck may hold an original by utilizing, for example, mechanical clamping, vacuum suction, or electrostatic attraction.

Also, a fine-motion stage may be provided on the stage 4, and the original 3 may be placed on the fine-motion stage. In this case, the fine-motion stage can be finely driven with respect to the stage 4 so as to highly accurately position the original 3.

The linear motors include movers 5 fixed on both sides of the stage 4 and each having a permanent magnet, and stators 6 fixed to the base 1, each comprising a plurality of coils. The coils are arranged along the movement direction, and fixed to the base 1 via supporting portions. The permanent magnets of the movers 5 are arranged to face the coils in a non-contact manner with a space therebetween. Magnetic flux from the permanent magnets causes electric current to flow through the coils when passing the coils, whereby the stage 4 is driven in the Y direction within a movement stroke. Japanese Patent Laid-Open No. 2004-79639 discloses such a configuration of a linear motor, and hence, detailed description thereof is omitted. Note that the driving unit is not limited to a linear motor, and may be other kinds of driving units. In view of accuracy, an electromagnetic actuator capable of driving a stage in a non-contact manner may be used.

The position of the stage 4 is measured using an interferometer. A reflection mirror 15 is provided on the stage 4. A light source provided outside the stage 4 emits measurement light to the reflection mirror 15. The reflected light from the reflection mirror 15 is caused to interfere with reference light, whereby the position of the stage 4 can be measured accurately.

Figure 3:
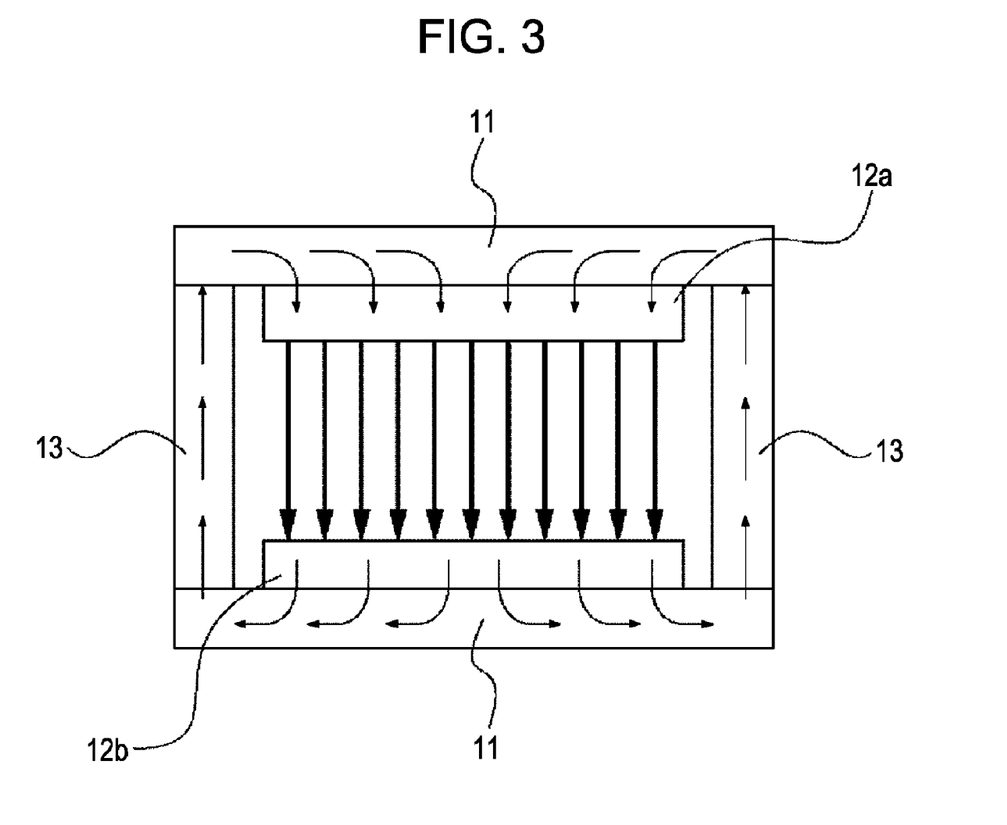
FIG. 3 is an illustration showing a magnetic circuit of the repulsive stator.

Next, a force applying unit that applies a force to the stage 4 by using the repulsive force from permanent magnets is described with reference to FIG. 1B. The force applying unit includes repulsive movers 7 and repulsive stators 10. Each repulsive mover 7 has a permanent magnet 9 (first magnet), and a supporting portion 8 that supports the permanent magnet 9 at the stage 4. Each repulsive stator 10 has a pair of permanent magnets 12a and 12b (second magnets), and yokes 11 and 13 that allow the magnetic flux caused by the permanent magnets 12a and 12b to circulate via lateral sides. FIG. 3 shows the details of the yokes 11 and 13. As shown in FIG. 3, by providing the yokes 11 and 13 (magnetic-flux reinforcement units), a magnetic circuit (in directions indicated by arrows) can be formed, and the magnetic flux flowing between the permanent magnets 12a and 12b can be reinforced. Accordingly, the repulsive force generated by the force applying unit can be increased.

The repulsive movers 7 are disposed at front and back sides of the stage 4 in the movement direction. The repulsive stators 10 are disposed at positions distant from the stage 4 in the movement direction. In particular, the repulsive stators 10 are provided at both ends of the movement stroke of the stage 4. When the stage 4 is driven in the movement direction, one of the permanent magnets 9 is interposed between the corresponding pair of permanent magnets 12a and 12b in a non-contact manner in the vicinity of one or both ends of the stroke of the stage 4.

The permanent magnet 9 has a plate-like shape, and is vertically magnetized. In this embodiment, the permanent magnet 9 is a permanent magnet in which the upper surface of the permanent magnet 9 is the N-pole and the lower surface thereof is the S-pole. The permanent magnets 12a and 12b also have plate-like shapes, and are vertically magnetized (in the Z direction). The permanent magnets 12a and 12b are magnetized such that like poles of the permanent magnets 9 and 12a face each other, whereas like poles of the permanent magnets 9 and 12b face each other. That is, the permanent magnets 12a and 12b are arranged such that the lower surface of the upper permanent magnet 12a is the N-pole, and the upper surface of the lower permanent magnet 12b is the S-pole.

With such a configuration, magnetically repulsive forces are generated between the permanent magnet 9 and the permanent magnet 12a, and between the permanent magnet 9 and the permanent magnet 12b, and thus, an acceleration or deceleration force in the Y direction can be applied to the stage 4. Since a direction in which the acceleration or deceleration force is generated is orthogonal to the magnetization direction of the permanent magnets 9, 12a, and 12b, the repulsive forces can be generated in a wide region even if the stage 4 moves. Also, since the permanent magnet 9 is interposed between the permanent magnets 12a and 12b, a repulsive force generated in the Z direction can be canceled.

Figure 1B:
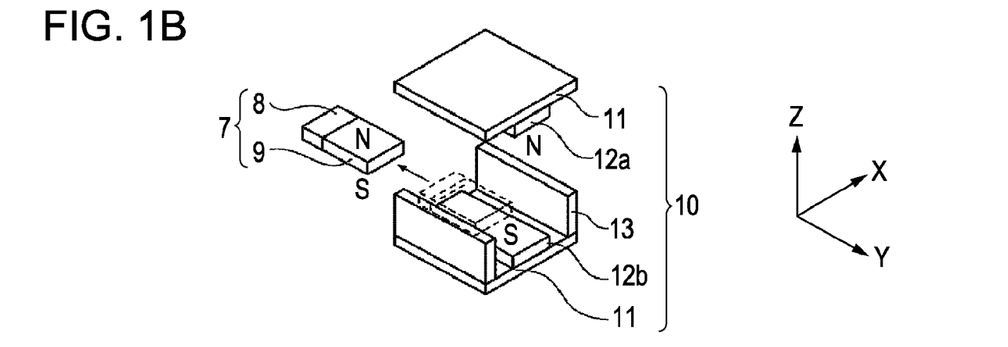
Figure 2:
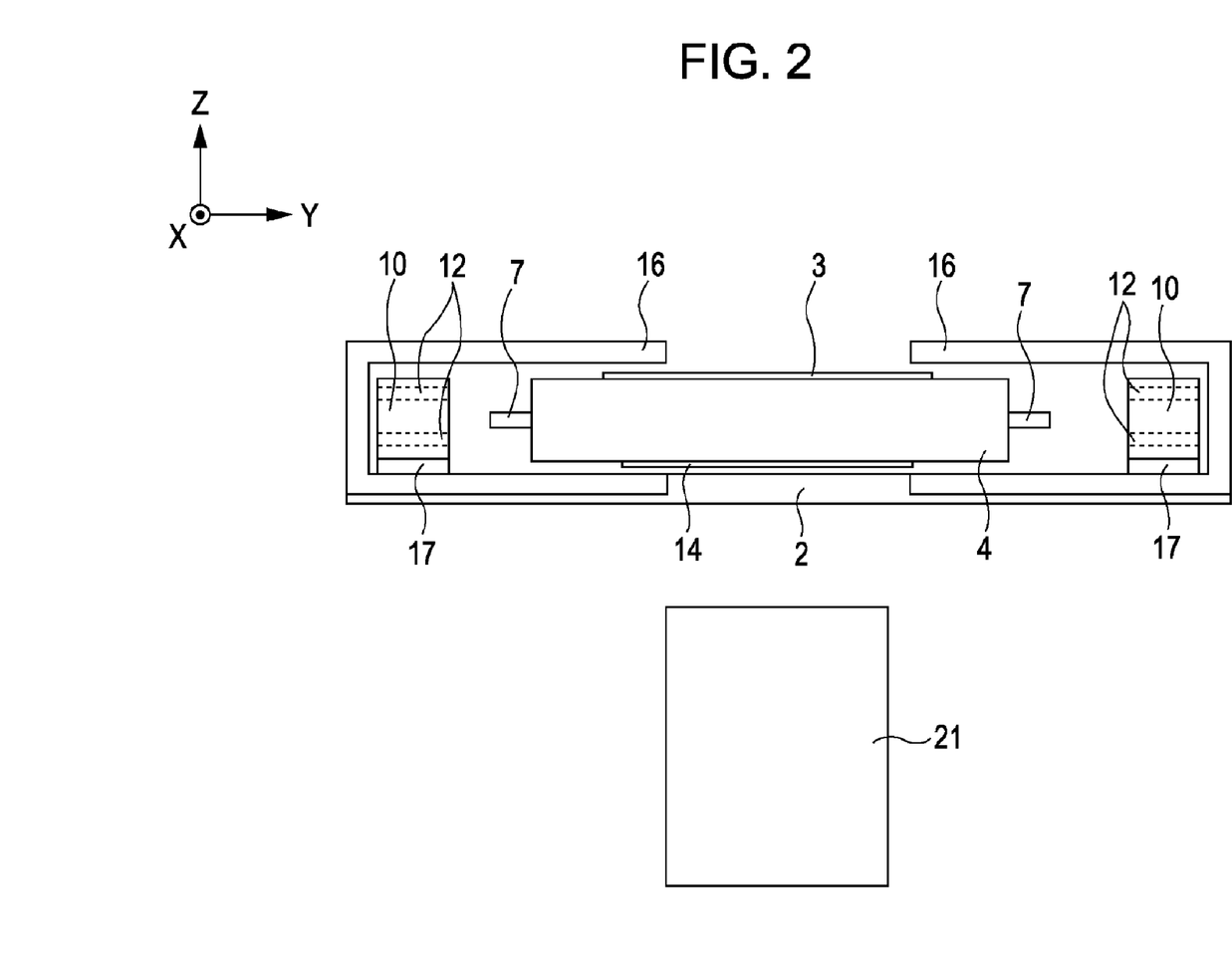
FIG. 2 is a side elevation showing the stage device.

When the stage 4 is located at one end of the stroke, the permanent magnet 9 is inserted between the permanent magnets 12a and 12b to a position indicated by a dotted line in FIG. 1B. At this time, the repulsive mover 7 receives a repulsive force in a direction indicated by an arrow. As the repulsive mover 7 moves in the direction indicated by the arrow in FIG. 1B from the position indicated by the dotted line, the repulsive force decreases. When the repulsive mover 7 is sufficiently distant from the repulsive stator 10, the repulsive force becomes substantially zero. If the stage 4 is arranged to be accelerated to a maximum speed before the repulsive force becomes substantially zero, the stage 4 moves to an opposite end of the stroke at an initial speed because the stage 4 is not in contact with the guide 2. Kinetic energy of the stage 4 is conserved until the repulsive mover 7 and the repulsive stator 10 generate the force at the opposite end of the stroke, and hence, the permanent magnet 9 is inserted between the permanent magnets 12a and 12b at the opposite end of the stroke by an amount equivalent to that shown in FIG. 1B, and is stopped. Although air resistance or a deceleration effect caused by the gas bearings 14 may be applied to the stage 4, the speed of the stage 4 may be kept constant by using the linear motors 23. Then, the stage 4 is accelerated again with the repulsive force. The stage 4 is accelerated or decelerated, and is reciprocated as described above. Since the force applying unit need only generate a small force, heat generated by driving of the linear motors 23 can be markedly reduced.

In such a configuration in which the stage is accelerated or decelerated by using the repulsive force caused by the permanent magnets 9, 12a, and 12b, magnetic flux may leak to the surrounding when the repulsive force is generated. In particular, a stage device with a high acceleration may cause large leakage flux, and thus, magnetic substances provided close to the stage may be attracted to it.

An exposure apparatus usually employs a magnetic substance in a part of a lens barrel that supports a plurality of lenses as a projection optical system 21. If the magnetic substance of the lens barrel is attracted towards the stage, exposure accuracy may be decreased. In addition to the case of the lens barrel, an illumination optical system, a measurement sensor, and the like, may suffer from similar problems.

To overcome this, a magnetic shield 16 is provided in this embodiment. The magnetic shield 16 reduces magnetic flux leaking from the magnets to the surroundings. The magnetic shield 16 is described below in detail.

The magnetic shield 16 is provided on the guide 2 to surround the repulsive stator 10. The magnetic shield 16 is disposed at both ends of the movement stroke of the stage 4. A nonmagnetic member 17 is provided between the magnetic shield 16 and the repulsive stator 10. The repulsive stator 10 is supported by the nonmagnetic member 17. Alternatively, the repulsive stator 10 may be supported independently from the magnetic shield 16, and a gap may be provided therebetween. The material of the magnetic shield 16 may have a high magnetic permeability, and may be, for example, ferrite.

The magnetic shield 16 can be disposed between the force applying unit and a member which should not be affected by the magnetic flux leaking from the force applying unit. In particular, the magnetic shield 16 can be arranged to surround the periphery of the force applying unit. Such a member which should not be affected by the magnetic flux may be, for example, the lens barrel that supports the projection optical system 21 in the exposure apparatus.

Since the magnetic shield 16 is provided at the repulsive stator 10, a large magnetic shield is not required for the stage (mover) 4. This may prevent the weight of the stage 4 from being increased.

Figure 4A:
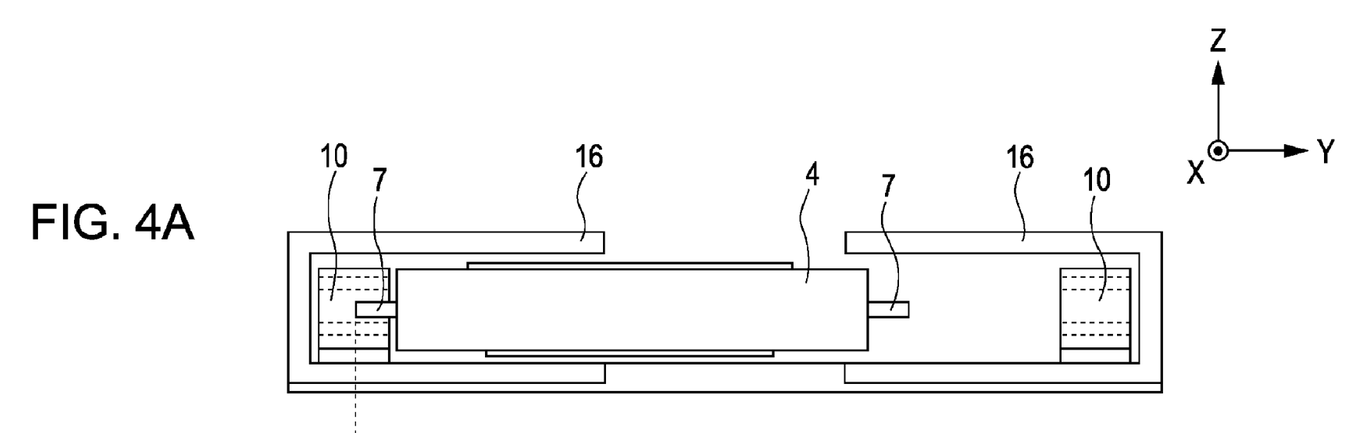
FIGS. 4A and 4B are illustrations showing the relationship between the length of a movement stroke and the length of a magnetic shield.
Figure 4B:
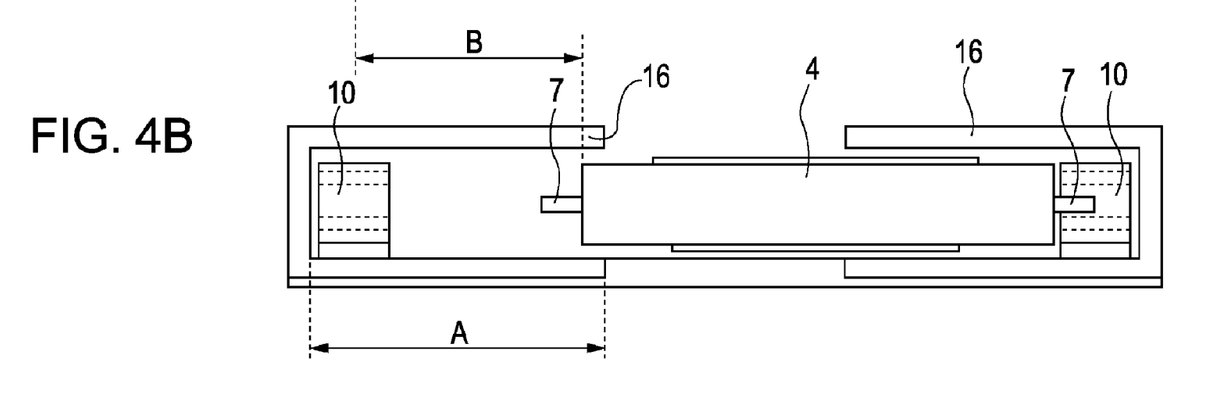

FIGS. 4A and 4B are illustrations for explaining the length of the magnetic shield 16 in more detail. FIGS. 4A and 4B are views of the stage device when viewed in direction IV in FIG. 1A.

FIG. 4A illustrates the stage 4 located at one end of the movement stroke, and FIG. 4B illustrates the stage 4 located at the opposite end. The magnetic shield 16 can be larger than the movement stroke. In this embodiment, the dimension of the magnetic shield 16 is determined as follows: A>B; where A is a length of the magnetic shield 16 in the Y direction, and B is the sum of a maximum movement distance of the stage 4 in the Y direction and a length of the permanent magnet 9 in the Y direction. The maximum movement distance of the stage 4 in the Y direction is a movement distance when the stage 4 moves from the one end to the opposite end of the movement stroke. With this arrangement of the magnetic shield 16, the magnetic shield 16 can shield also magnetic flux generated solely by the permanent magnet 9 of the repulsive mover 7.

When the repulsive mover 7 is inserted to or extracted from the repulsive stator 10, the distance between the repulsive mover 7 and the repulsive stator 10 varies, and the amount of leakage flux may dynamically vary accordingly. In addition, when the stage 4 moves, the repulsive mover 7 moves relative to the magnetic shield 16, and the magnetic flux generated by the repulsive mover 7 passing the magnetic shield 16 may vary. Due to these variations, eddy current is generated for the magnetic shield 16, and the magnetic shield 16 is heated. Moreover, the position where the eddy current is generated may vary as the stage 4 moves.

The heat caused by the eddy current may generate fluctuations in a measurement light path of the interferometer that measures the position of the stage 4, causing a measurement error, and the heat may cause a thermal deformation of the stage 4, thereby decreasing the positioning accuracy of the stage 4.

Figure 5A:
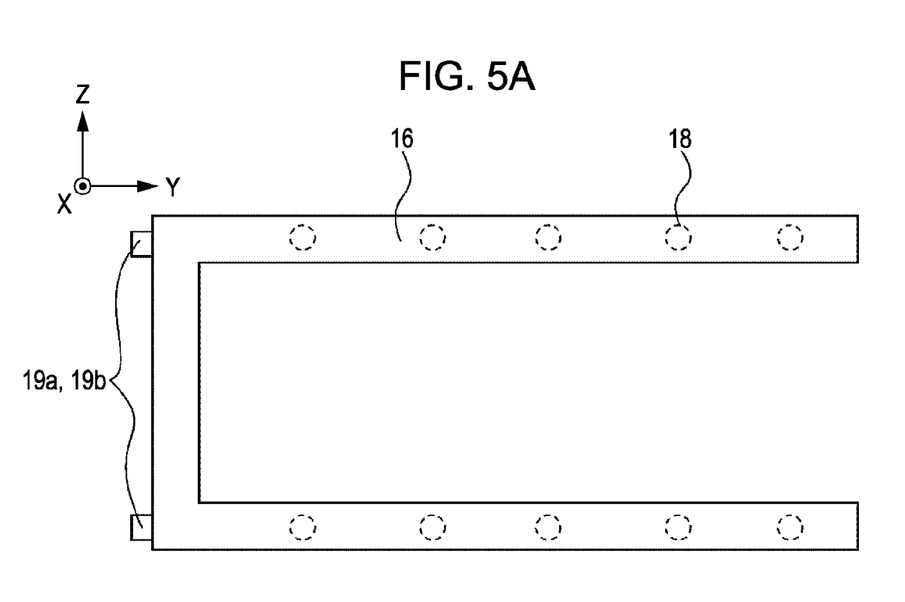
FIGS. 5A and 5B are illustrations showing a cooling mechanism for the magnetic shield.

As a countermeasure for the eddy current, for example, a cooling system that cools the magnetic shield 16 is provided in this embodiment. FIG. 5A is an illustration showing the cooling system. The cooling system is provided in the magnetic shield 16, and includes a passage 18 that allows a fluid refrigerant to circulate therethrough, a supply port 19a through which the refrigerant is supplied to the passage 18, and a recovery port 19b through which the refrigerant is recovered from the passage 18. The passage 18 may be a groove formed in the magnetic shield 16, or may be a cavity provided in the magnetic shield 16, or a pipe provided on the surface thereof. The supply port 19a and the recovery port 19b may be plural. In this case, a plurality of passages may be provided having a uniform flow resistance from the supply ports to the recovery ports.

Figure 5B:
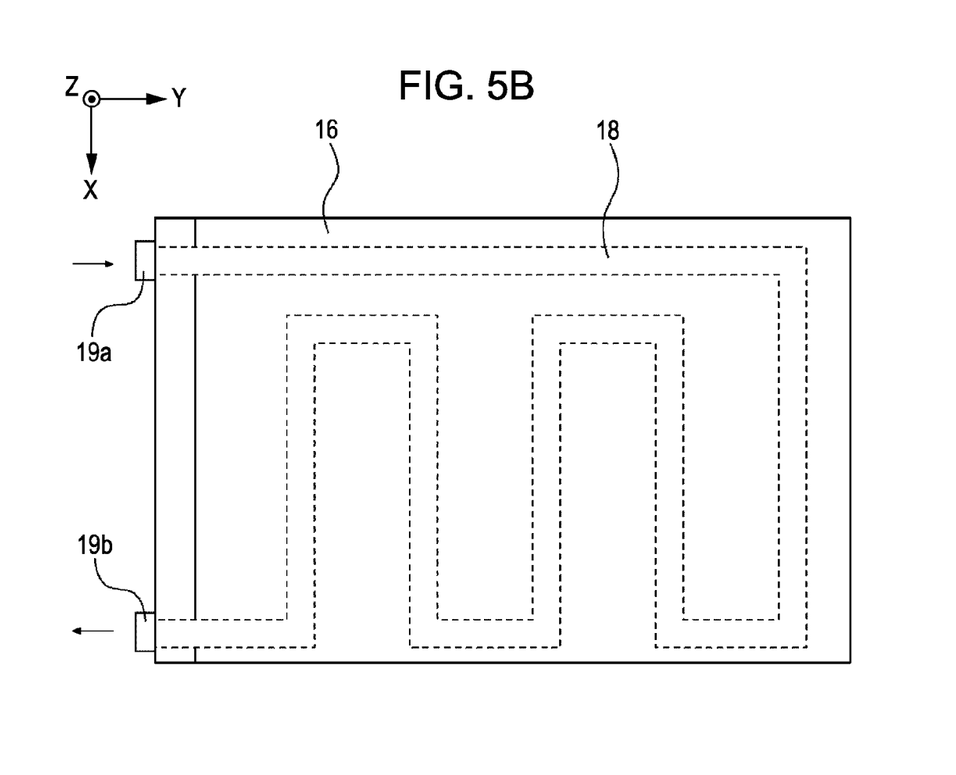

Note that the shapes of the passage 18, supply port 19a, and recovery port 19b are not limited to those shown in FIGS. 5A and 5B, and the shapes may be designed suitably to recover the heat of the magnetic shield 16 efficiently.

Since the cooling system is provided at the magnetic shield 16, the heat caused by the eddy current generated in the magnetic shield 16 can be reduced. This configuration is effective especially when the magnetic shield 16 is provided at the repulsive stator 10. This is because eddy current is generated due to not only the change in magnetic flux occurring when a force is generated between the repulsive mover 7 and the repulsive stator 10, but also a change in magnetic flux occurring when the repulsive mover 7 moves relative to the magnetic shield 16.

Figure 6:
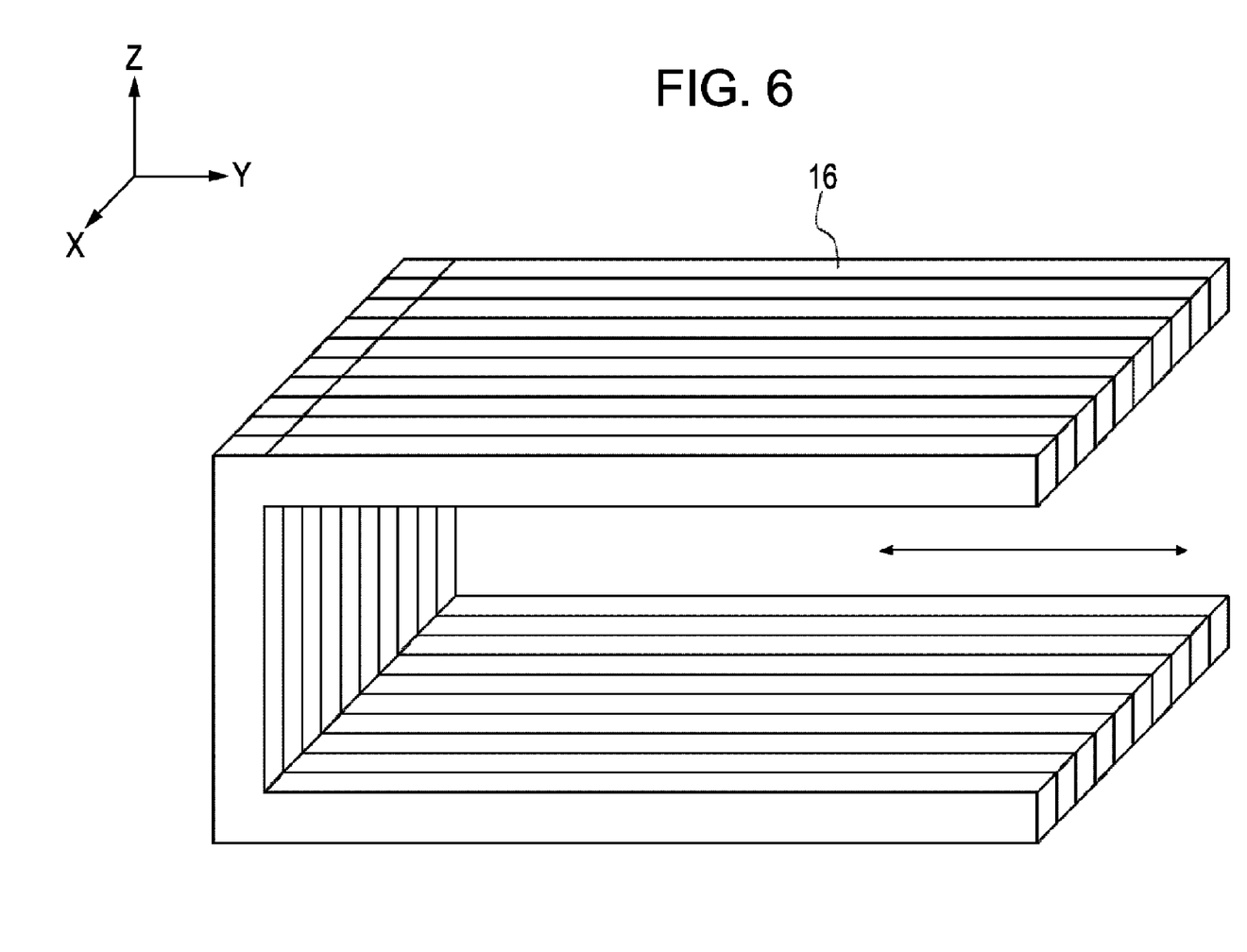
FIG. 6 is a perspective view showing a laminated structure of the magnetic shield.

As another countermeasure for the eddy current, the magnetic shield 16 has a laminated structure in this embodiment. FIG. 6 is a perspective view showing the laminated structure of the magnetic shield. In particular, the magnetic shield 16 has a plurality of members. The members are laminated in a direction parallel to the facing sides of the permanent magnet 9 of the repulsive mover 7 and the permanent magnets 12a and 12b of the repulsive stator 10 (direction parallel to the X-Y plane), and in a direction (X direction) orthogonal to the movement direction of the stage 4 (direction indicated by an arrow in FIG. 6, or the Y direction).

With the laminated structure of the magnetic shield 16, the amount of eddy current generated can be reduced.

As a further countermeasure for the eddy current, the material of the magnetic shield 16 has a high resistance in this embodiment. Also, the material of the magnetic shield 16 may have a high magnetic permeability as described above so as to serve as a shield. For example, the material may be ferrite, or a metal injection molding (MIM) member. One or more of these countermeasures may be implemented.

In this embodiment, while the force applying unit has the exemplary configuration that the permanent magnet 9 is inserted between the pair of permanent magnets 12a and 12b, it is not limited thereto. In addition, while the force applying units may be provided at both ends of the stage, a force applying unit may be provided at only one of the ends of the stage. In particular, any configuration can be employed as long as the force applying unit includes a first magnet coupled to the stage, and a second magnet provided at an end of the movement stroke of the stage, so as to face the first magnet at this end, and configured to apply a force to the stage by using a repulsive force generated between the first and second magnets.

Second Embodiment

Figure 7A:
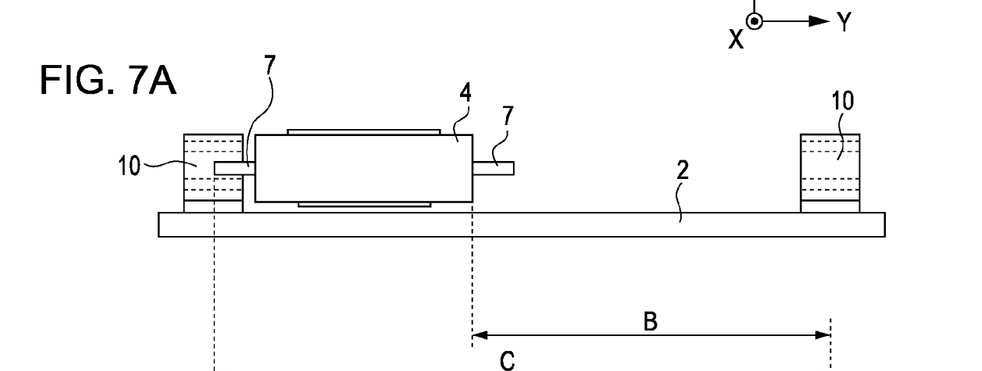
FIGS. 7A to 7C are illustrations showing the relationship between the length of the movement stroke and the length of the magnetic shield according to a second embodiment.
Figure 7B:
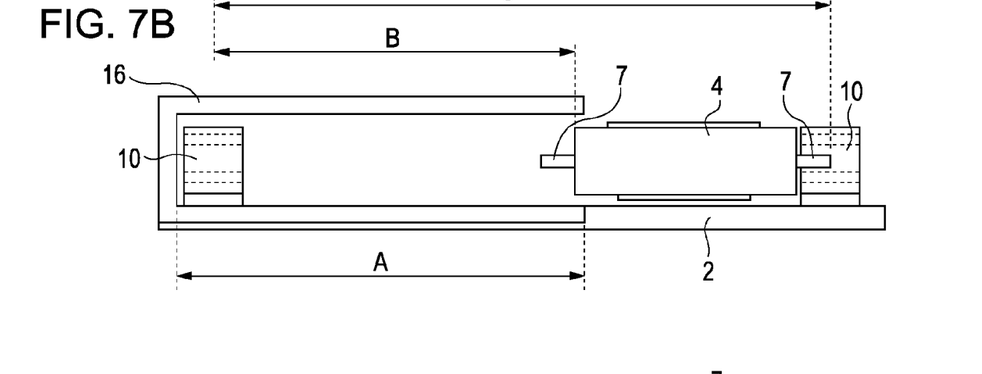
Figure 7C:
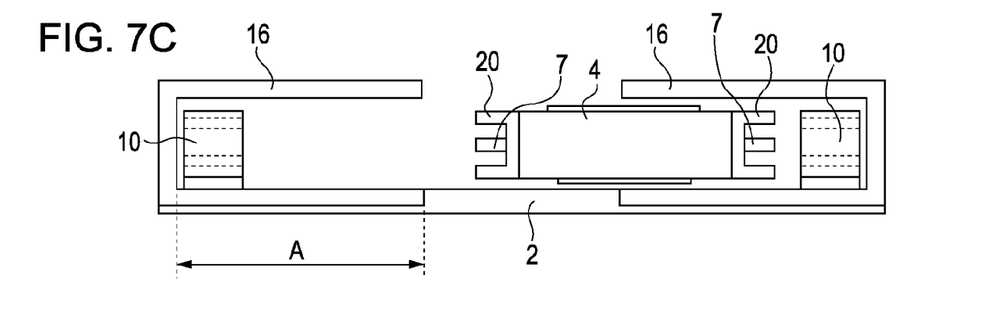

FIG. 7C is an illustration showing a stage device according to a second embodiment. While the magnetic shield is provided only at the repulsive stator 10 in the first embodiment, magnetic shields are provided at both the repulsive stator 10 and the repulsive mover 7 in the second embodiment. Parts of the second embodiment similar to those of the first embodiment are not described here.

In the second embodiment, since the magnetic shield 16 is provided at the repulsive stator 10, major magnetic flux caused by a force generated between the repulsive mover 7 and the repulsive stator 10 is shielded by the magnetic shield 16. Thus, a magnetic shield 20 that is provided at the repulsive mover 7 does not have to be large.

Such a magnetic shield may be added to the repulsive mover 7 in the first embodiment, however, the magnetic shield for the repulsive mover 7 is suitable for a configuration with a large movement stroke as shown in FIG. 7C. The movement stroke is described below.

In FIG. 7A, a maximum movement distance B of the stage 4 in the Y direction is larger than a distance C/2 from an end to the center of the movement stroke of the stage 4.

In this case, if the length A of each of the magnetic shields 16 provided at both ends of the stroke like the first embodiment is increased to be larger than the maximum movement distance B (in FIG. 7B, the length of one of the magnetic shields 16 is increased), then the two magnetic shields 16 may interfere with each other. In a case of a reticle stage of an exposure apparatus, a reticle placed on a stage is irradiated with exposure light substantially at the center of a movement stroke of the stage. In this case, the exposure light may be blocked if the length of the magnetic shield 16 is larger than the distance C/2 from the end to the center of the movement stroke.

Therefore, as shown in FIG. 7C, the length A of the magnetic shield 16 is smaller than the distance C/2 from the end to the center of the movement stroke.

Since the magnetic shield 20 is provided at the repulsive mover 7 in this embodiment, if the permanent magnet 9 of the repulsive mover 7 is moved to the outside of the magnetic shield 16, the magnetic flux of the permanent magnet 9 affects the surroundings less.

To be more specific, the magnetic shield 20 is arranged to surround the permanent magnet 9 provided at the stage 4. The magnetic shield 20 may be provided between the permanent magnet 9 and a member (for example, lens barrel) which should not be attracted by the magnetic force of the permanent magnet 9, and in particular, it may be arranged to surround the periphery of the permanent magnet 9.

Although eddy current is generated for the magnetic shield 20, the effect of the heat can be reduced in a manner similar to that of the first embodiment.

Third Embodiment

Figure 8:
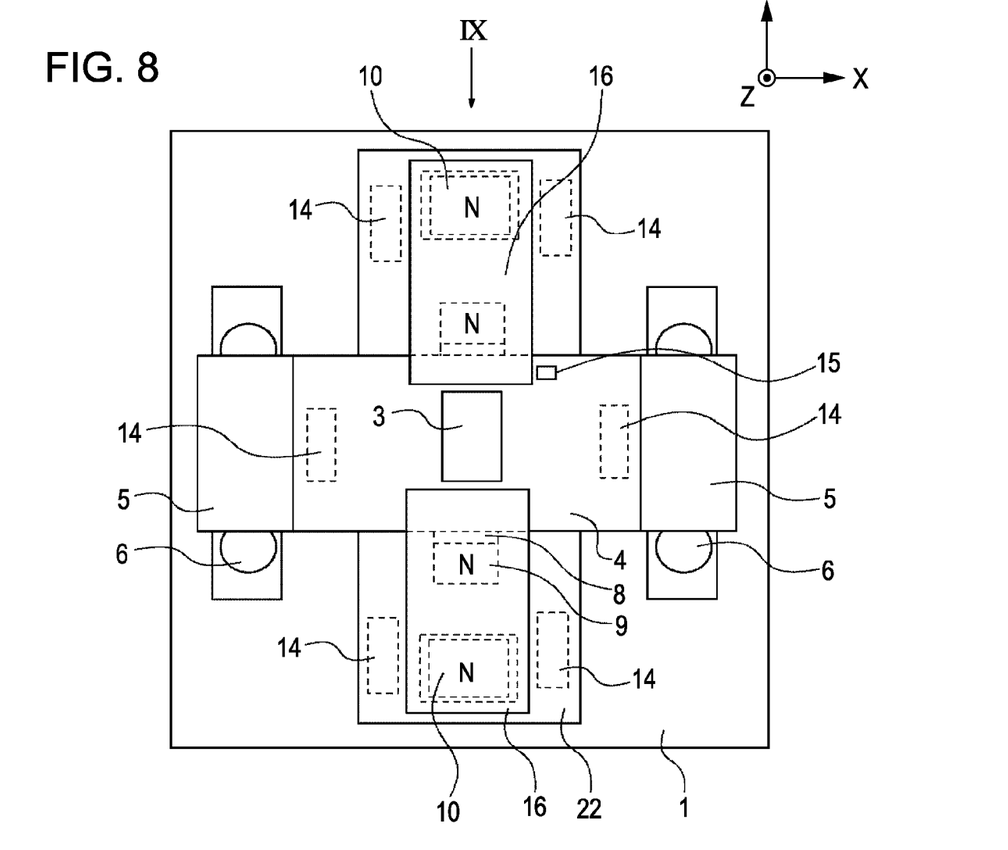
FIG. 8 is a plan view showing a stage device with a countermass according to a third embodiment.
Figure 9:
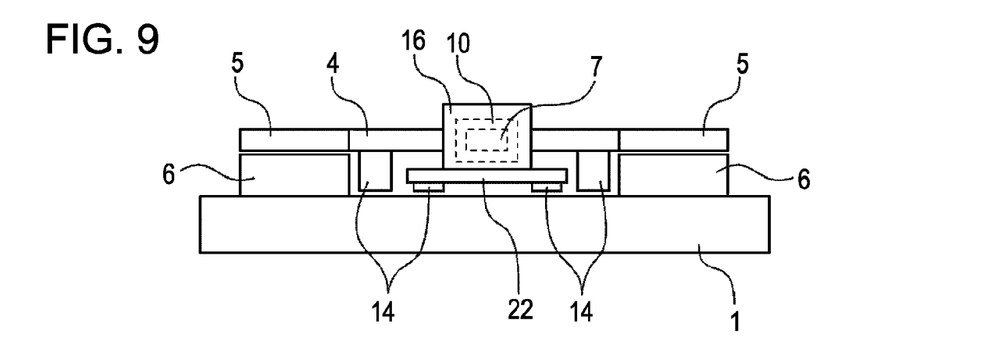
FIG. 9 is a front elevation showing the stage device with the countermass of FIG. 8.

FIG. 8 is a top plan view showing a stage device according to a third embodiment. FIG. 9 is a front elevation viewed in direction IX of FIG. 8. While the repulsive stators 10 and the magnetic shields 16 are provided at both ends of the guide 2 in the first and second embodiments, repulsive stators 10 and magnetic shields 16 are disposed on both ends of a countermass 22 that is movable along an axis in the third embodiment. Configurations of the third embodiment similar to those of the first and second embodiments are not described here.

In the stage device, a stage 4 with an original 3 placed thereon is supported movably on a base 1. The stage 4 is supported by gas bearings 14 provided between the upper surface of the base 1 and the lower surface of the stage 4. The repulsive stator 10 that applies an acceleration or deceleration force to the stage 4 is fixed to the countermass 22. The repulsive stator 10 is disposed at each of both ends of a stroke of the countermass 22. The countermass 22 is movable along an axis. The countermass 22 is supported by gas bearings 14 provided between the upper surface of the base 1 and the lower surface of the countermass 22. Since the repulsive stator 10 is fixed to the countermass 22 that is movable along the axis, the repulsive stator 10 moves in a direction opposite to the direction of the repulsive mover 7 because of a reaction force of driving of the stage 4. Accordingly, driving the countermass 22 with the repulsive stator 10 fixed thereto cancels the reaction force generated when the stage 4 is driven with a high acceleration using the magnetically repulsive acceleration. The magnetic shield 16 is provided on the countermass 22 to surround the repulsive stator 10. The magnetic shield 16 is disposed at both ends of the countermass 22.

As described above, the magnetic shield 16 may be applied to the countermass configuration that is employed to prevent the entire device from vibrating by canceling the reaction force transmitted to the base 1 even if the stage 4 is driven at a high acceleration using a magnetically repulsive acceleration unit.

With this embodiment, the magnetic flux leaking to the surroundings when the repulsive force is generated can be reduced by arranging the repulsive stators 10 and the magnetic shields 16 on both ends of the countermass 22.

Exemplary Embodiment of Exposure Apparatus Using Stage Apparatus

Figure 10:
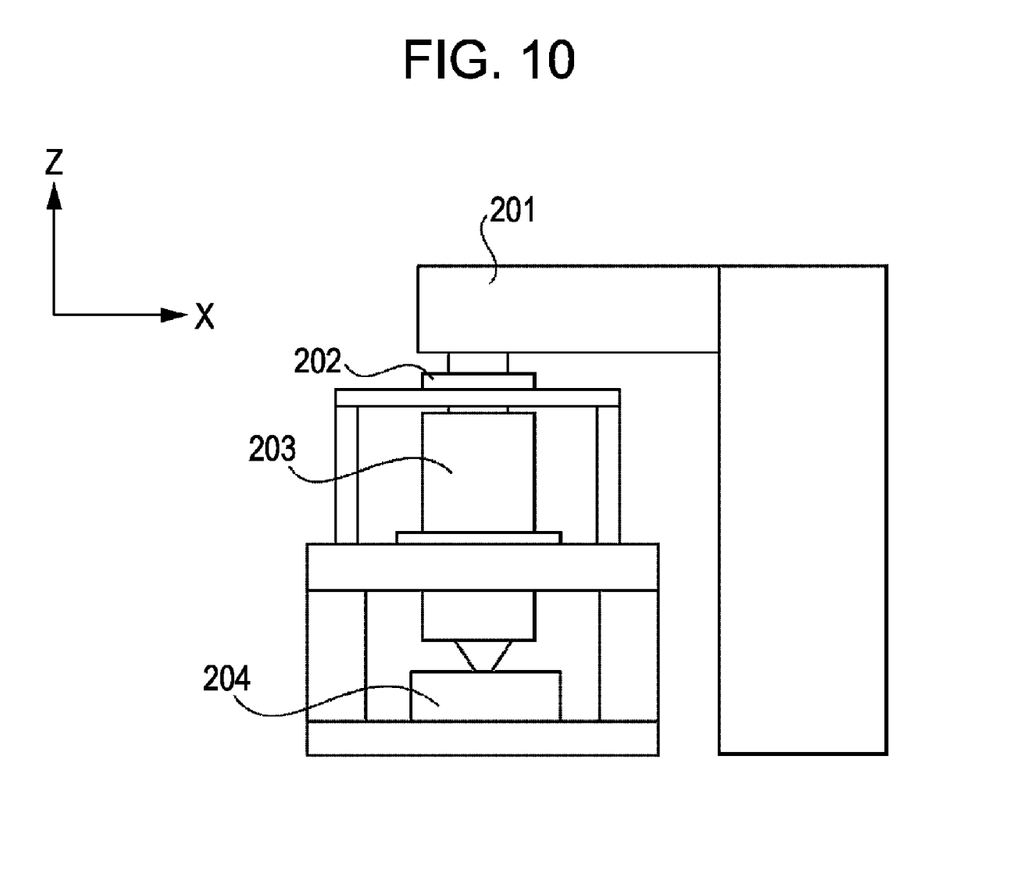
FIG. 10 is an illustration showing an exposure apparatus using the stage device.

Next, an exemplary embodiment of an exposure apparatus using the stage device of the above embodiments is described. As shown in FIG. 10, an exposure apparatus includes an illumination device 201, a reticle stage 202 with a reticle placed thereon, a projection optical system 203, and a wafer stage 204 with a wafer placed thereon. The exposure apparatus projects a circuit pattern from the reticle onto the wafer by exposure using a step-and-repeat method or a step-and-scan method.

The illumination device 201 has a light source portion and an illumination optical system, and illuminates the reticle having the circuit pattern formed thereon. The light source portion employs, for example, a laser as a light source. The laser may be an ArF excimer laser with a wavelength of about 193 nm, a KrF excimer laser with a wavelength of about 248 nm, or an F2 excimer laser with a wavelength of about 153 nm. The laser is not limited to excimer lasers, and YAG lasers and other kinds of lasers can be also used. The number of lasers is also not limited. In the case of using such a laser as a light source, a beam shaping optical system that shapes a parallel light beam emitted from the laser light source to be a desired beam shape, and an incoherent optical system that converts a coherent laser beam into an incoherent laser beam may be used. The light source that can be used in the light source portion is not limited to lasers, and lamps, such as one or more mercury lamps and xenon lamps, can also be used.

The illumination optical system illuminates a mask, and includes a lens, a mirror, a light integrator, an aperture stop, etc.

The projection optical system 203 can be an optical system including only a plurality of lens elements, an optical system including a plurality of lens elements and at least one concave mirror (catadioptric optical system), an optical system including a plurality of lens elements and at least one diffractive optical element, such as a kinoform, or an optical system including only a plurality of mirrors.

The reticle stage 202 and the wafer stage 204 can be moved by, for example, linear motors. When the step-and-scan method is used, the reticle stage 202 and the wafer stage 204 are moved in synchronization with each other. In addition, an actuator is provided on at least one of the wafer stage 204 and the reticle stage 202 to position the pattern of the reticle with respect to the wafer.

The above-described exposure apparatus can be used for manufacturing a semiconductor device, such as a semiconductor integrated circuit, a micromachine, and a device like a thin film magnetic head having a micropattern.

Device Manufacturing Method Using Exposure Apparatus

Figure 11:
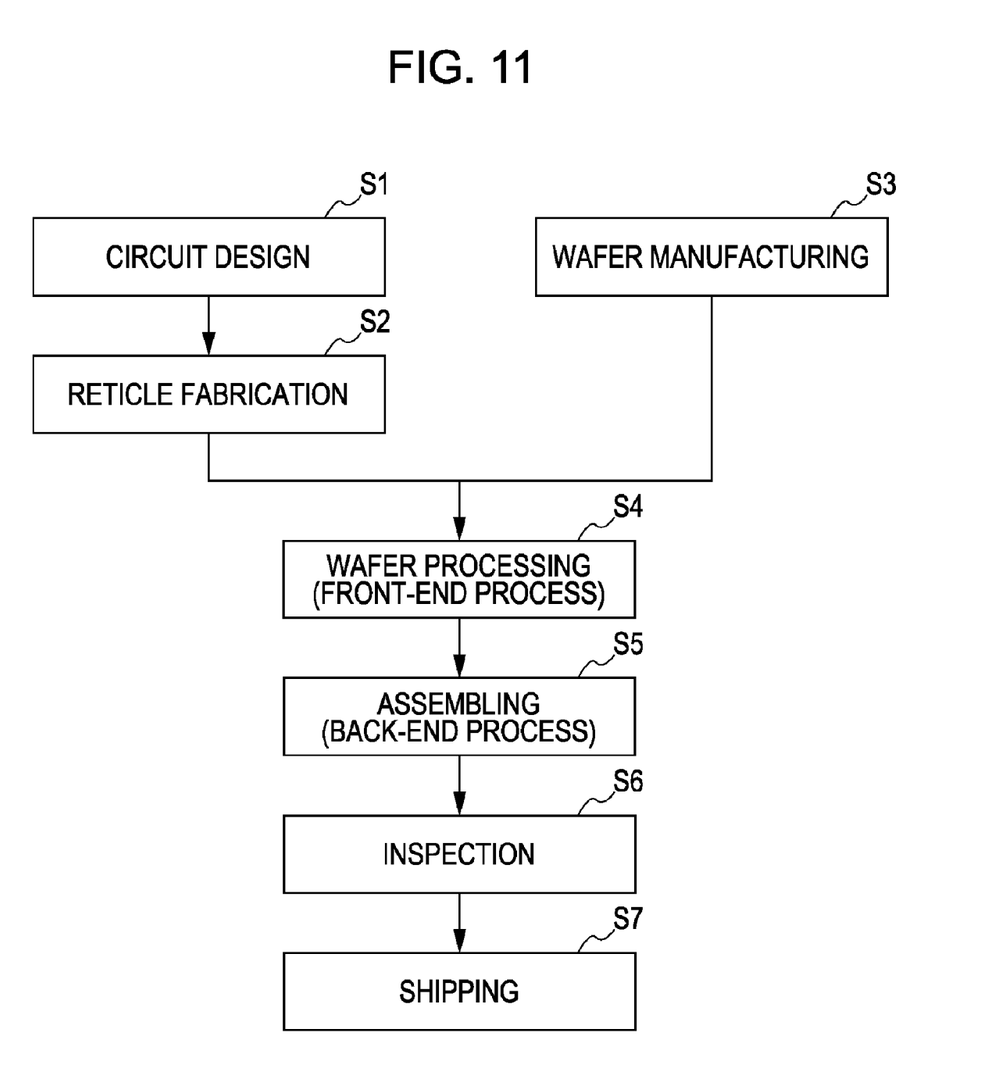
FIG. 11 is a flowchart for explaining processes of manufacturing devices using the exposure apparatus.

An exemplary embodiment of a device manufacturing method using the above-described exposure apparatus is described with reference to FIGS. 11 and 12. FIG. 11 is a flowchart showing processes of manufacturing devices (for example, semiconductor chips like ICs and LSIs, LCDs, and CCDs). In this embodiment, a manufacturing method of semiconductor chips is described.

In step S1 (circuit design), a circuit of semiconductor chips is designed. In step S2 (mask fabrication), one or more masks are fabricated in the designed circuit pattern. In step S3 (wafer manufacturing), a wafer is formed of a material such as silicon. In step S4 (wafer processing), called a front-end process, actual circuits are formed on the wafer by lithography with the masks and the wafer using the above-described exposure apparatus. In step S5 (assembling), called a back-end process, semiconductor chips are formed from the wafer fabricated in step S4. This process includes an assembly process (dicing and bonding), a packaging process (chip sealing), and the like. In step S6 (inspection), the semiconductor chips manufactured in step S5 are tested for, e.g., operation and durability. The semiconductor chips are thus completed through the above processes, and are then shipped (step S7).

Figure 12:
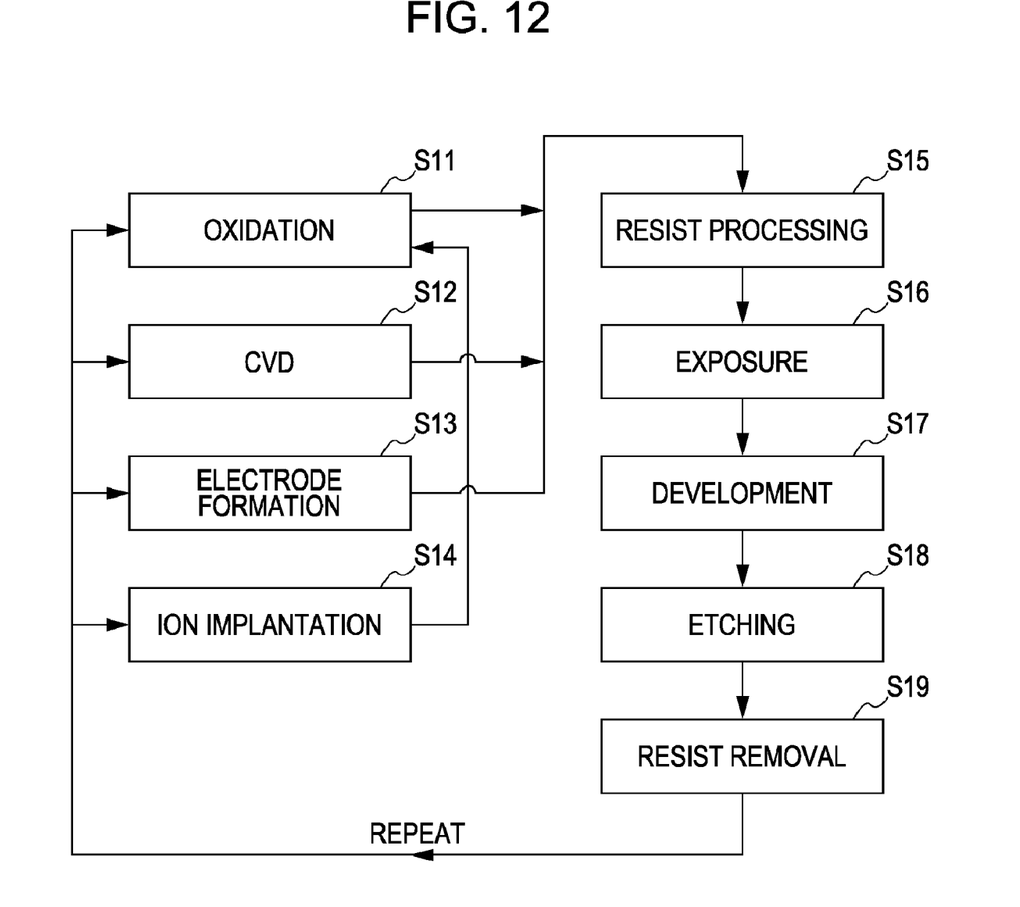
FIG. 12 is a flowchart specifically showing a wafer process in step S4 of the flowchart shown in FIG. 11.

FIG. 12 is a flowchart specifically showing the wafer process in step S4. In sub-step S11 (oxidation), the surface of the wafer is oxidized. In sub-step S12 (CVD), an insulating film is formed on the surface of the wafer. In sub-step S13 (electrode formation), electrodes are formed on the wafer by deposition. In sub-step S14 (ion implantation), ions are implanted in the wafer. In sub-step S15 (resist processing), a photosensitive agent is applied to the wafer. In sub-step S16 (exposure), the circuit pattern of the mask is projected onto the wafer through exposure using the exposure apparatus. In sub-step S17 (development), the exposed resist is developed. In sub-step S18 (etching), parts other than the developed resist image are etched away. In sub-step S19 (resist removal), the resist, which becomes unnecessary after etching, is removed. By repeating these steps, a multi-layer circuit pattern is formed on the wafer.

With the stage device that accelerates or decelerates the stage by using the repulsive force of the magnets, the magnetic flux can be prevented from leaking to the surroundings when the magnets generate the repulsive force, and the peripheral components can be thus prevented from being affected by the leakage magnetic flux.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2007-005582 filed Jan. 15, 2007, and No. 2007-322424 filed Dec. 13, 2007, which are hereby incorporated by reference herein in their entirety.

What is claimed is:

1. A device comprising:
a stage;
a force applying unit configured to apply a magnetically repulsive force to the stage, the force applying unit including a first magnet provided at the stage, and a second magnet provided at an end of a movement stroke of the stage, so as to face the first magnet;
a driving unit configured to drive the stage within the movement stroke;
a magnetic-flux reinforcement unit configured to reinforce magnetic flux of the second magnet; and
a magnetic shield, different from the magnetic-flux reinforcement unit, configured to shield the magnetic flux of the second magnet,
wherein the dimension of the magnetic shield in the movement direction of the stage is larger than the maximum movement distance of the first magnet, and the magnetic shield is arranged so as to cover the first magnet in an entire area of the movement stroke of the stage.

2. The device according to claim 1,
wherein the first and second magnets are arranged to face each other when applying the force to the stage, and
wherein the magnetic shield includes a plurality of members, the members being laminated in a direction parallel to the facing sides of the first and second magnets and in a direction orthogonal to the movement direction of the stage.

3. A device comprising:
a stage;
a force applying unit configured to apply a force to the stage using a magnetically repulsive force, the force applying unit including first magnets provided at front and back sides of the stage in a movement direction thereof, and second magnets provided at both ends of a movement stroke of the stage and each having a pair of magnets facing each other;
a driving unit configured to drive the stage within the movement stroke;
a magnetic-flux reinforcement unit configured to reinforce magnetic flux flowing between each pair of magnets; and
a magnetic shield, different from the magnetic-flux reinforcement unit, configured to shield the magnetic flux of each second magnet,
wherein the dimension of the magnetic shield in the movement direction of the stage is larger than the maximum movement distance of the first magnet, and the magnetic shield is arranged so as to cover the first magnet in an entire area of the movement stroke of the stage.

4. An exposure apparatus comprising:
a projection optical system configured to project a pattern of an original onto a substrate, the projection optical system including:
a stage adapted to carry an original;
a force applying unit configured to apply a magnetically repulsive force to the stage, the force applying unit including a first magnet provided at the stage, and a second magnet provided at an end of a movement stroke of the stage, so as to face the first magnet;
a driving unit configured to drive the stage within the movement stroke so as to bring about movement of the carried original;
a magnetic-flux reinforcement unit configured to reinforce magnetic flux of the second magnet; and
a magnetic shield, different from the magnetic-flux reinforcement unit, configured to shield the magnetic flux of the second magnet,
wherein the dimension of the magnetic shield in the movement direction of the stage is larger than the maximum movement distance of the first magnet, and the magnetic shield is arranged so as to cover the first magnet in an entire area of the movement stroke of the stage.

5. The exposure apparatus according to claim 4, wherein at least a part of the magnetic shield is arranged between a lens support in the projection optical system and the second magnet.

* * * * *